United States Patent [19]
Fink et al.

[11] Patent Number: 5,519,579
[45] Date of Patent: May 21, 1996

[54] METHOD AND APPARATUS FOR REPLACING DIRECTLY ATTACHED CHIP

[75] Inventors: Peter Fink, Althengstett; Heinz G. Horbach, Gechingen, both of Germany

[73] Assignee: International Business Machines Corporation, Armonk, N.Y.

[21] Appl. No.: 986,826

[22] Filed: Dec. 8, 1992

[30] Foreign Application Priority Data

Dec. 19, 1991 [DE] Germany ............... 91121799

[51] Int. Cl.⁶ .................................................. H05K 7/02
[52] U.S. Cl. .................. 361/760; 361/761; 361/767; 29/830; 257/690
[58] Field of Search ............................. 361/380, 395, 361/397, 400, 401, 403, 404, 406, 408, 421, 2, 760, 748, 753, 761, 772, 777, 774, 767, 813, 803; 174/52.2, 52.4, 255, 260, 261; 257/690, 697, 786, 787; 439/55; 29/830

[56] References Cited

U.S. PATENT DOCUMENTS

| | | | |
|---|---|---|---|
| 4,705,917 | 11/1987 | Gates, Jr. et al. | 174/52 FP |
| 4,907,128 | 3/1990 | Solomon et al. | 361/412 |
| 5,013,687 | 5/1991 | Solomon | 437/209 |
| 5,031,022 | 7/1991 | Yamamoto et al. | 23/48 |
| 5,093,708 | 3/1992 | Solomon | 357/68 |
| 5,105,257 | 4/1992 | Michii | 357/70 |
| 5,157,476 | 10/1992 | Yoshida | 357/70 |
| 5,231,304 | 7/1993 | Solomon | 257/684 |

FOREIGN PATENT DOCUMENTS 0083265  7/1983  European Pat. Off. .

OTHER PUBLICATIONS

Schrottke, G., "Test and Repair of Direct Chip Attach Modules", IBM Technical Disclosure Bulletin, vol. 31, No. 3, Aug. 1988, pp. 39–40.
Gons, S., "Reworkable Chip–On–Board Package", IBM Technical Disclosure Bulletin, vol. 29, No. 3, Aug. 1986, pp. 1433–1434.

*Primary Examiner*—Leo P. Picard
*Assistant Examiner*—Y. Whang
*Attorney, Agent, or Firm*—William P. Skladony

[57] ABSTRACT

The invention is a method for replacing integrated circuit chips directly attached on printed circuit boards, and a board and a replacement card module that may be used to practice the method. As the first step, the electronic component and the surrounding fan-out wiring area on the board is mechanically removed, e.g., by micro-milling, typically leaving a recess in the board. A card module having a replacement electronic component and associated fan-out wiring is attached in the recess of the board by common bonding agents. The card module is designed so that its fan-out wiring matches the removed fan-out wiring, and hence is adapted for attachment to the board wiring. After attaching the card module, the wiring of the board is electrically connected with the wiring of the card module by wire bonding, tape automated bonding or other appropriate solder techniques.

9 Claims, 3 Drawing Sheets

METHOD AND APPARATUS FOR REPLACING DIRECTLY ATTACHED CHIP

FIELD OF THE INVENTION

The invention relates to a method for replacing integrated circuit chips directly attached on printed circuit boards and to a card module used in practicing the method.

BACKGROUND OF THE INVENTION

To reduce the complexity of packaging integrated circuit chips, techniques have been developed for directly mounting the chip on the board. This so-called direct chip attach (DCA) or chip-on-board (COB) packaging can provide the smallest and cheapest package among various packaging technologies.

The devices directly attached on the boards are usually electrically connected by wire bond or tape automated bonding (TAB) technology which typically requires protection from process chemicals, dust and humidity. Thus, a resin encapsulant is placed over the chip and the wiring connecting the chip pads with the board.

In case of a malfunction of such an encapsulated chip, the chip generally cannot be removed and replaced without damaging the circuitry and the organic carrier (board). Replacing a defective chip with a new one using the normal direct chip attach soldering process is also not possible. Thus, a fully assembled board generally often has to be scrapped when the presence of a defective chip is detected.

In the IBM Technical Disclosure Bulletin, Vol. 29, No. 3, August 1986, p. 1433, a reworkable chip-on-board package is disclosed, in which chips are back bonded in a recess. In case of malfunction, a second chip is back bonded on top of the defective chip. Before the replacement chip is fixed on top of the first chip, the wire bond pads are removed. This method requires a recess for the chip and allows only one rework cycle per chip.

IBM Technical Disclosure Bulletin, Vol. 31, No. 3, August 1988, p. 39, shows the test and repair of direct chip attach modules which are C4-bonded (controlled collapsed chip connection), in which a thermode is placed on the back side of the substrate on which the chip is directly attached. The thermode is used to reflow the solder, thereby allowing removal of the chip. This method can only be used with single layer substrates and nonsealed chips.

The present invention as claimed therefore is intended to remedy these drawbacks by providing a new replacement technique for directly attached chips.

SUMMARY OF THE INVENTION

As the first step in the method of the present invention, the defective electronic component and the surrounding fan-out wiring area on the board are mechanically removed. The electronic component, which usually is a chip with a plurality of input and output (I/O) terminals arranged close together, uses a fan-out wiring to connect the relatively widely spaced wiring lines on the board to the relatively closely spaced I/O terminals of the chip. The present method involves removing at least the fan-out wiring and the chip, thereby creating a rectangular region on the board where the wiring and chip are not present. With this removal, at least a thin layer of the board will also be removed, thereby providing a recess in the board. In a multilayer printed circuit board, this recess should have a depth which does not influence the next wiring layer. The mechanical removal can be accomplished by appropriate methods well known to a person skilled in the art, the only requirement being that the method chosen is exact enough to provide a defined region with a defined depth. A preferred mechanical removal technique is micro milling.

A card module is then attached to the board where the electronic component and fan-out wiring were removed. The card module has a fan-out wiring layout designed to match that portion of the board where the electronic component was removed. The module also includes a chip that is directly attached thereto. The module is placed in the region on the board where the chip and fan-out wiring were removed. Preferably, the card module is the same size as such region so that the card module can be inserted in the recess to minimize the length of the connections between the card module and the wiring on the board. It is also possible to use a card module having contact means on the bottom side, which module is somewhat larger than the recess left after removing the chip and fan-out wiring to permit the module to be connected by solder balls to the wiring on the board. The card module may be attached in the recess of the board using known bonding agents.

After positioning and attaching the card module, the wiring of the board is electrically connected with the wiring of the card module. This can be accomplished by wire bonding, tape automated bonding, or other appropriate solder techniques.

The method of this invention may be practiced using a printed circuit board having at least one wiring layer on top of the board that is designed to facilitate the practice of the present invention. The board can be a multilayer board or a board only having wiring on the top and/or bottom surface. The wiring layer(s) of the board comprises contact means which are arranged on the wiring lines leading to the contact pads of the directly attached component. The contact means, which are spaced a predetermined distance from the component, are used to electrically connect the wiring lines on the board with the wiring lines on the card module. The electrical connection can be performed by wire bonding, tape automated bonding or other appropriate solder bonding. Thus, depending upon the connection technique used, the contact means may comprise lands, blind holes, or other structures, as preferred. If it is desired to connect the module to the board by solder bonding, the card module may be designed to include soldered contact means at the side thereof for making electrical contact with the blind hole in the wiring of the board. It is an important feature that these contact means are arranged on the wiring of the board adjacent the fan-out wiring area to allow a replacement of a directly attached chip and its corresponding fan-out wiring area by a card module having a replacement chip and fan-out wiring. The contact means should be as close as possible to the fanout wiring area in order to minimize (1) the length of the connecting wires and (2) the size of the recess on the board.

Preferably, the card module of the present invention comprises a thin carrier card with an electronic component directly attached thereto and connected to a fan-out wiring which ends at the edges of said carrier. The carrier card also includes contact means for electrically connecting the fan-out wiring to the wiring of the board. The carrier can be made of the usual card material (organic or inorganic material), with the card being as thin as possible to facilitate handling of the card module and to minimize the length of the wiring used to connect the module to the board. The chip on the card is also directly attached and connected in known manner to the fan-out wiring on the carrier card. The arrangement of the chip and the fan-out wiring correspond to the arrangement of the fan-out wiring and chip on the printed circuit board. The fan-out wiring should terminate at the edges of the carrier card to minimize the length of the wiring connections to the board. Thus, the contact means on the card module are preferably arranged at the end of the fan-out wiring and comprise lands on the top side of, or vias on the bottom side of, the card module. The vias are used to provide an electrical contact to the board wiring via solder balls. For special applications, contact areas preferably covered with solder may extend over the sides of the card module to permit electrical connection with respective areas in a recess on the board. The chip on the card module can be covered by an encapsulant. The card module is functionally identical to the direct chip attach site on the board, except that it includes additional contact means for electrical connection. The size of the card module depends mainly on the size of the chip, the number of connections, and the geometry of the groundrules.

The present invention provides a complete solution to the direct chip attach replacement problem. Such replacement provides cost saving because a board having one defective directly attached chip need not be scrapped. Instead, by modifying the wiring layout of the board slightly, defective chips can be easily replaced. The card module can be built and tested inclusive of burn-in stress test prior usage (which is not possible on the original DCA chip). The removal of the defective chip can be accomplished by well known and exact mechanical methods.

BRIEF DESCRIPTION OF THE DRAWINGS

For a better understanding of the present invention, together with further objects and advantages, preferred embodiments of the invention are described hereinafter in connection with reference to the accompanying drawings, in which.

DETAILED DESCRIPTION OF THE INVENTION

Referring to FIGS. 1–5, the present invention is a card module 20 that is mounted on a board 4 in place of a defective chip 8 and its associated fan-out wiring 10. In addition, the present invention is a method of replacing a defective chip using card module 20 and a unique printed circuit board 4.

Figure 1:
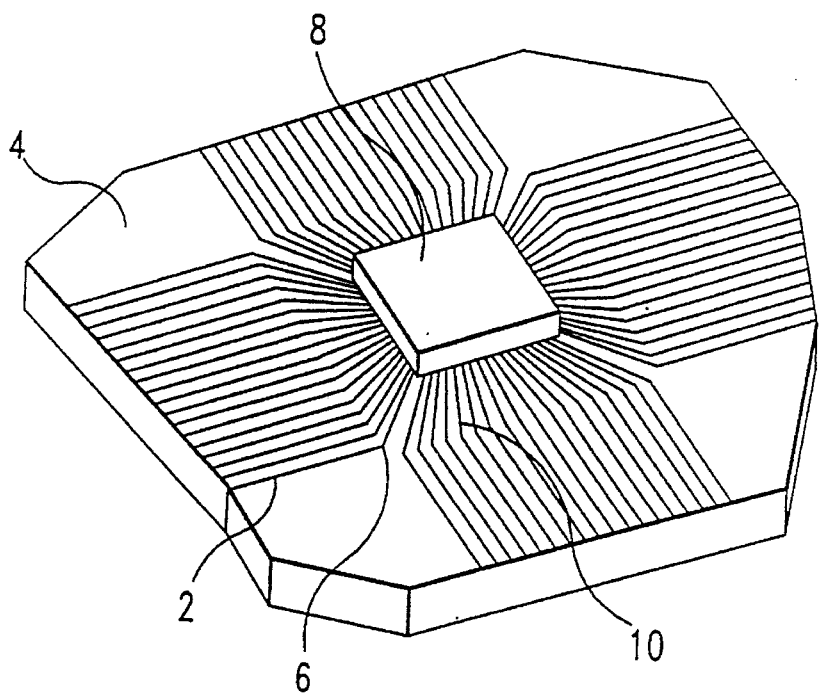
FIG. 1 is a perspective view of a portion of a printed circuit board illustrating a directly attached chip and corresponding fan-out wiring.

The method of the present invention may be practiced using board 4, a portion of which is illustrated in FIGS. 1–5. The wiring 2 on the board 4 includes lands 6 (FIG. 2) which are spaced a predetermined distance from chip 8. The lands 6 are arranged adjacent the fan-out wiring area 10 of board 4 used to connect the closely spaced chip pads 12 (FIG. 2) with the more widely spaced board wiring. In FIG. 1, only the wiring on the top of the board 4 is shown. However, typically the board 4 will be a multilayer printed circuit board. The chip 8 can be connected by controlled collapsed chip connection (C4) technology with the face down to the board or by TAB or wire bond technology. As mentioned above, other suitable bonding techniques can also be used. For clarity of the illustration, the encapsulant usually protecting the chip is not shown.

Figure 3:
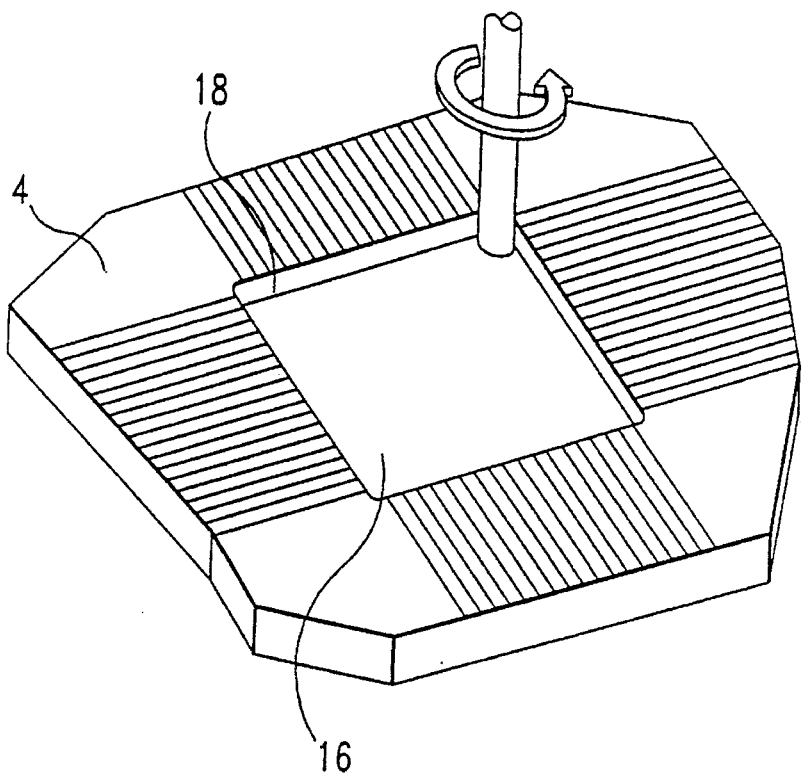
FIG. 3 is similar to FIG. 1, except that the chip and fan-out wiring have been removed resulting in the formation of a recess in the board at the location where the chip and fan-out wiring were removed.
Figure 2:
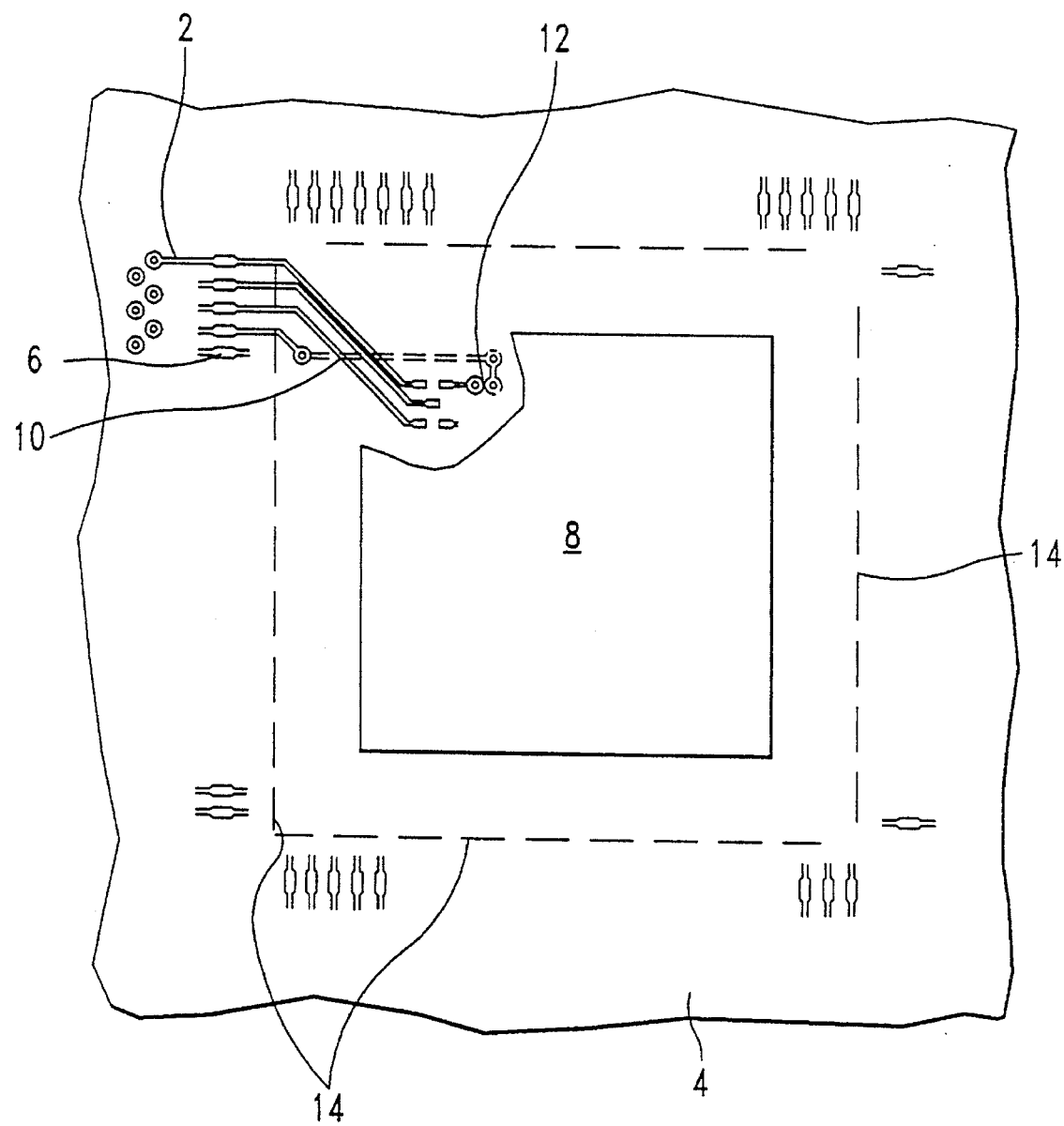
FIG. 2 is a schematic top view of the wiring associated with a directly attached chip.
Figure 4:
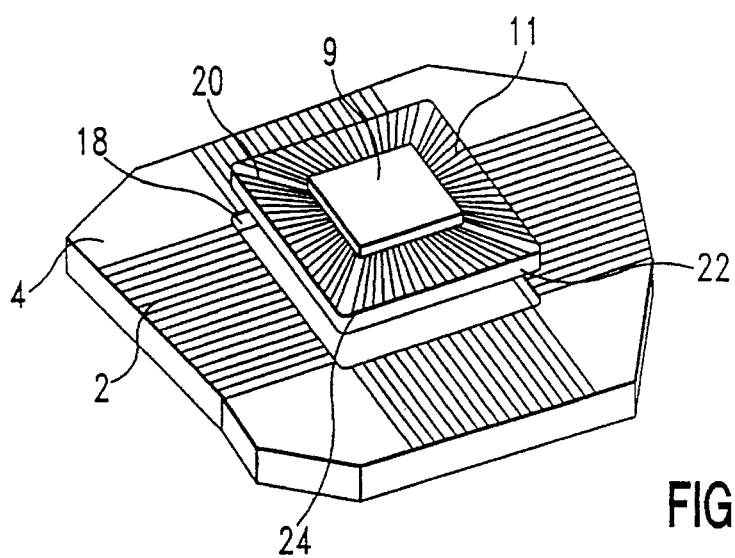
FIG. 4 is similar to FIG. 3, except that a card module has been positioned over the recess.

FIG. 2 is a schematic top view of a portion of the wiring design on the top of the printed circuit board 4, with a portion of the chip being broken away to reveal the pads 12 and adjacent wiring structure. In this embodiment the chip is connected to the board using C4 technology. Around the fan-out wiring area 10, lands 6 on the wiring 2 are indicated. Between the fan-out wiring area 10 and the lands 6 a cutting line 14 is shown. The present method involves removing the fan-out wiring 10 and the chip 8 along cutting line 14 using known techniques such as micro milling, as shown in FIG. 3. The design of the fan-out wiring 10 and the lands 6 is chosen so that complete disconnection of the fan-out wiring of the chip to be replaced may be accomplished. The geometry of the lands 6 has to correspond to the appropriate design specifications, e.g., for 400 μm wiring, a land size of 200 μm×300 μm, with a 200 μm spacing between lands.

As illustrated in FIG. 3, removal of a defective directly attached chip 8 and fan-out wiring area 10 by micro milling results in the formation of a recess 16 in the board 4. Preferably, recess 16 corresponds in size to that of the fan-out wiring area 10. The border 18 of the recess 16 coincides with cutting line 14 (FIG. 2). Recess 16 is preferably formed to a depth such that the wiring in the board leading to the removed chip is effectively broken but the wiring planes located in a multilayer board below the recess remain unchanged.

After forming recess 16, card module 20 (FIG. 4) is inserted therein. The card module 20 comprises a fully tested chip 9 which is connected to a fan-out wiring 11 arranged on the carrier 22 for the card module. The carrier 22 has a size and configuration corresponding to that of recess 16 and a thickness of 0.3 to 0.7 mm (which corresponds to the depth of the recess). Fan-out wiring 11 comprises lands 24 positioned at the edges of carrier 22. Lands 24 are used to electrically connect the fanout wiring 11 of the card module 20 to the wiring 2 of the board 4. The fan-out wiring 11 has a configuration similar to that of the removed fan-out wiring 10.

Figure 5B:
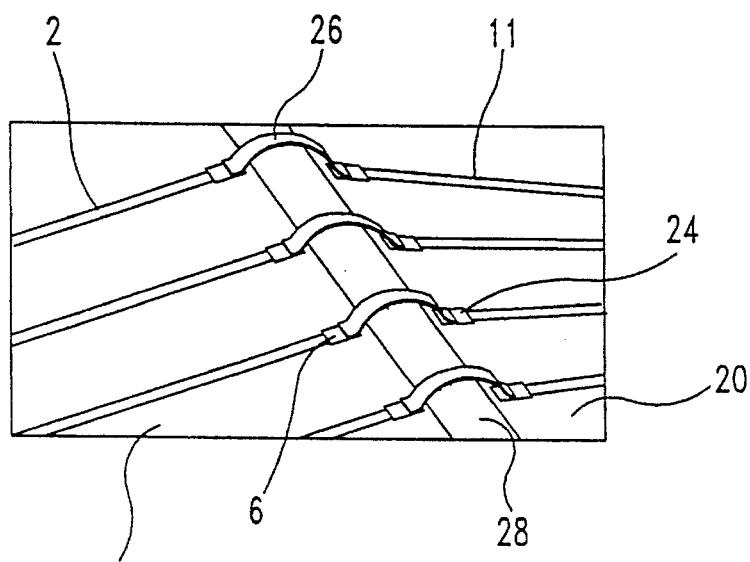
FIG. 5B shows a portion of the module and board, as blocked in FIG. 5A, enlarged to more clearly illustrate the electrical connection between the module wiring and the board wiring.
Figure 5A:
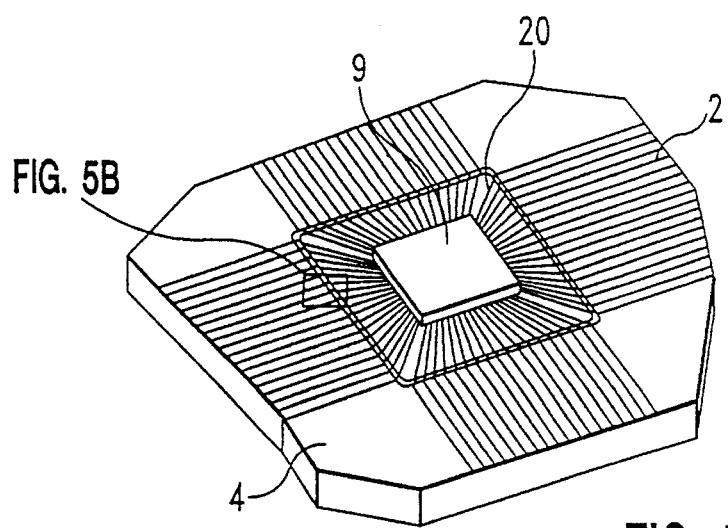
FIG. 5A is similar to FIG. 4, except that the card module has been mounted in the recess.

In FIG. 5A a complete board 4 is shown, comprising card module 20 inserted and attached, e.g., by gluing with an adhesive, in the recess 16. The fan-out wiring 10 of the card module 20 is connected via wire bonds 26 to the wiring 2 on the board 4, as shown in an enlarged detail view in FIG. 5B. The gap 28 between the card module 20 and the board 4 should be as small as possible to provide short wire bonds 26. The wire bonds 26 are also protected by a resin encapsulant (for purpose of clarity, not shown). Once the defective chip and associated fan-out wiring has been replaced with a card module 20, it is difficult to detect that such replacement has occurred. Under special circumstances a board might be constructed in this way with fully tested card modules.

What is claimed is:

1. A printed circuit board module comprising:

a printed circuit board having a surface, said surface including a plurality of board wiring lines for carrying electrical signals, said surface further including a recess which has an edge and which extends to a given depth relative to said surface, said edge of said recess defining a terminal end for each of said board wiring lines; and a card having an electronic component mounted thereon, said card further including a plurality of card wiring lines electrically connected to said component, said card being mounted in said recess, and said card wiring lines being electrically connected to said board wiring lines.

2. The printed circuit board module of claim 1 wherein said card wiring lines are in a fan out configuration that mates with the fan out configuration of said printed circuit board wiring lines with said card inserted in said recess.

3. The printed circuit board module of claim 2 wherein said card wiring lines have a fan out configuration which generally surrounds said chip mounted on said card.

4. The printed circuit board module of claim 1 wherein said card wiring lines are electrically connected to corresponding printed circuit board wiring lines by means of a wire bond.

5. A method of replacing an electronic component directly attached to a printed circuit board, the printed circuit board including a wiring layer having a fan-out wiring surrounding the component, the method comprising the steps of:

(a) removing an electronic component and surrounding fan-out wiring from the board;

(b) providing a card module having a chip mounted thereon and fan-out wiring;

(c) attaching the card module to the board where the electronic component and surrounding fan-out wiring were removed; and (d) electrically connecting the fan-out wiring on the card module to the wiring layer of the board.

6. The method according to claim 1, wherein said step (a) involves forming a recess in the board having a size and configuration corresponding to that of the card module.

7. The method according to claim 1, wherein said step (a) involves removing the electronic component and fan-out wiring using micro milling.

8. The method according to claim 1, wherein said step (d) involves wire bonding the fan-out wiring to the wiring layer of the board.

9. The method according to claim 1, wherein said step (c) involves attaching said card module to said board by gluing.

* * * * *